United States Patent
Mui et al.

(10) Patent No.: US 7,482,178 B2
(45) Date of Patent: Jan. 27, 2009

(54) CHAMBER STABILITY MONITORING USING AN INTEGRATED METROLOGY TOOL

(75) Inventors: David S. L. Mui, Fremont, CA (US); Wei Liu, San Jose, CA (US); Hiroki Sasano, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 666 days.

(21) Appl. No.: 10/636,468

(22) Filed: Aug. 6, 2003

(65) Prior Publication Data
US 2005/0032250 A1    Feb. 10, 2005

(51) Int. Cl.
*H01L 21/00* (2006.01)
*H01L 21/66* (2006.01)

(52) U.S. Cl. ............... 438/14; 438/5; 700/121; 257/E21.218; 257/E21.232

(58) Field of Classification Search ........... 438/5, 438/14; 700/121
See application file for complete search history.

(56) References Cited

U.S. PATENT DOCUMENTS

| | | | |
|---|---|---|---|
| 5,926,690 A | 7/1999 | Toprac et al. | 438/17 |
| 5,948,203 A | 9/1999 | Wang | 156/345 |
| 6,161,054 A | 12/2000 | Rosenthal et al. | 700/121 |
| 6,368,975 B1 | 4/2002 | Balasubramhanya et al. | 438/710 |
| 6,388,253 B1 | 5/2002 | Su | 250/310 |
| 6,413,867 B1 | 7/2002 | Sarfaty et al. | 438/689 |
| 6,424,417 B1 | 7/2002 | Cohen et al. | 356/388 |
| 6,455,437 B1 | 9/2002 | Davidow et al. | 438/710 |
| 6,486,492 B1 | 11/2002 | Su | 257/48 |
| 6,788,988 B1 * | 9/2004 | Pasadyn et al. | 700/110 |
| 2002/0171828 A1 | 11/2002 | Cohen et al. | 356/328 |
| 2004/0117146 A1 * | 6/2004 | Liu et al. | 702/172 |

OTHER PUBLICATIONS

Lee, et al., "Analysis of Reflectometry and Ellipsometry Data from Patterned Structures," Characterization and Metrology for UCSI Technology: 1998 International Conference, Seiler, et al., eds., p. 331-335.
Raymond, "Angle-resolved scatterometry for semiconductor manufacture,", Microlithography World, Winter 2000.
Toprac, A., "AMD's Advanced Process Control of Ply-Gate Critical Dimension," Proc. SPIE vol. 3882, p. 62-65, Sep. 1999.
Yang, et al., "Line-profile and Critical Dimension Measurements Using a Normal Incidence Optical Metrology System," Proceedings of SPIE vol. 4689, Mar. 2002.

* cited by examiner

*Primary Examiner*—Alexander G Ghyka
(74) *Attorney, Agent, or Firm*—Patterson & Sheridan, LLP

(57) ABSTRACT

A method and apparatus for monitoring the stability of a substrate processing chamber and for adjusting the process recipe. Thickness and CD measurement data are collected before wafer processing and after wafer processing by an integrated or an in-situ metrology tool to monitor process chamber stability and to adjust the process recipe. The real time chamber stability monitoring enabled by the integrated metrology tool reduces the risk and cost of wafer mis-processing. The real time process recipe adjustment allows tightening of the process recipe. Process development cycle can also be reduced by the method and apparatus.

6 Claims, 9 Drawing Sheets

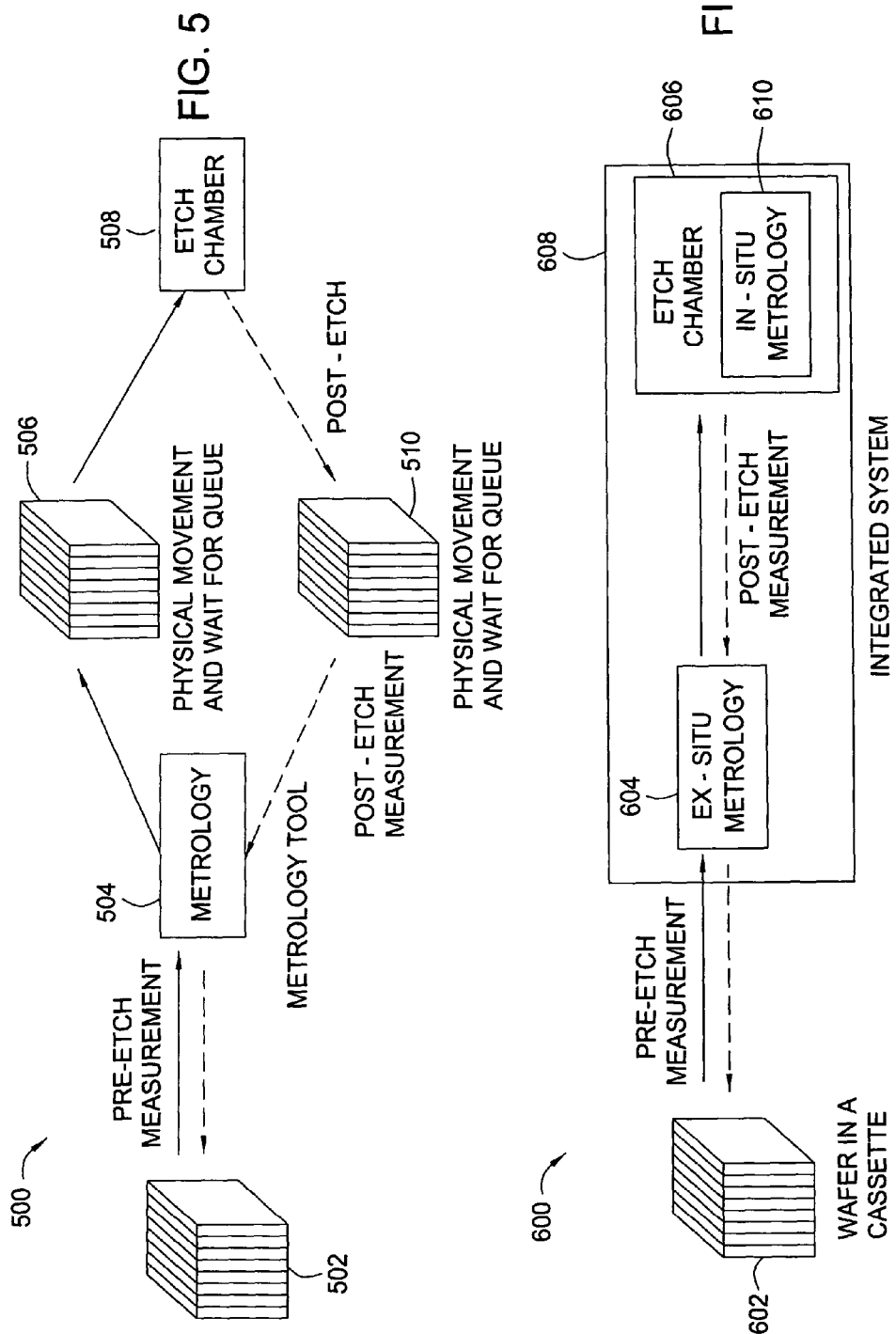

CHAMBER STABILITY MONITORING USING AN INTEGRATED METROLOGY TOOL

BACKGROUND OF THE INVENTION

1. Field of the Invention

The present invention relates to semiconductor substrate processing systems. More particularly, the present invention relates to techniques for monitoring the chamber stability and, in response, adjusting a process recipe to optimize substrate processing.

2. Description of the Related Art

Current demands for high density and performance associated with ultra large scale integration require sub-micron features, increased transistor and circuit speeds and improved reliability. Such demands require formation of device features with high precision and uniformity, which in turn necessitates careful process monitoring, including frequent and detailed inspections of the devices before the semiconductor wafers are diced into individual circuit chips.

Early detection of chamber fault or process drift is highly desirable, since it can prevent wafer mis-processing, which in turn reduces wafer scrapping, wafer rework and overall device production cost. In the fabrication of active and passive electronic devices on a substrate, a typical substrate has conducting, semiconducting, and dielectric features that form or interconnect the devices on the substrate. Typically, the material is formed on the substrate by, for example, a chemical vapor deposition (CVD), physical vapor deposition, ion implantation, oxidation or nitridation process. Thereafter, some of the substrate materials, which are generally in the form of a layer but may also have other shapes, may be processed, for example by etching, to form features shaped as cavities, channels, holes, vias or trenches.

As technology advances, it requires smaller feature sizes and tighter feature space to improve device performance and to achieve higher device density. It may also be desirable to etch deep features having high aspect ratio to provide faster circuits or otherwise higher signal processing efficiency. The aspect ratio of the feature is the ratio of the feature depth to its opening size. One example of feature patterning is silicon deep trench etch for DRAM trench capacitor fabrication.

In DRAM silicon deep trench capacitor fabrication, the opening size of the trenches may be less than about 0.14 microns and the depth of the trenches may be greater than 7 microns. The aspect ratio of these deep trenches could be higher than 50. It is difficult to etch features having high aspect ratio using conventional substrate processing techniques, especially when the features also have small opening sizes. This high aspect ratio trench etch process is generally sensitive to changes in the process chamber condition and to the sizes of the opening. Chamber condition can greatly affect plasma state and reactant concentration. It is difficult for reactants to penetrate deep into the trench through small openings and difficult for reaction by-products to be transported from inside the trench back out to the substrate surface through the same small openings.

Therefore, there is a need in the art for techniques of monitoring the process conditions of a process chamber to facilitate adapting the process recipe to the process conditions such that the substrate processing is improved.

SUMMARY OF THE INVENTION

The invention relates to a method and apparatus for monitoring the stability of a process chamber by measuring characteristics of material layers on a substrate with an integrated metrology tool. The invention trends the calculated process rate, which could include etch rate and deposition rate, of each wafer processed by the process chamber by measuring the film thickness on the substrate before and after substrate processing, and by recording the total process time to detect any process drift to prevent substrate mis-processing. The invention also utilizes the trended process rate and pre-process thickness measurement of the incoming wafer in adjusting the process recipe in real time to tighten the process control. Lastly, the invention also shortens process development cycle time by utilizing real time process information.

Embodiments of the invention provide a method of using an integrated metrology tool to monitor substrate processing that occurs in a processing chamber. The method includes placing the substrate in an integrated metrology tool before the substrate enters the processing chamber, collecting measurement data prior to substrate processing using the integrated metrology tool, moving the substrate into the processing chamber, processing the substrate in the processing chamber, recording the total processing time, placing the substrate in the integrated metrology tool after the substrate processing is completed, and collecting measurement data after substrate processing using the integrated metrology tool.

Another embodiment of the invention provides a method of adjusting a process recipe used by a processing chamber to process a substrate. The method includes placing the substrate in an integrated metrology tool before the substrate enters the processing chamber, collecting measurement data prior to substrate processing, in the integrated metrology tool, moving the substrate into the processing chamber, and adjusting the process recipe in real time in the processing chamber based on the pre-process measurement and a process rate trend.

In a further embodiment, the method of the invention calculates a process rate by manipulating the pre-processing thickness measurement, post-processing thickness measurement and the total processing time, trending the process rate, comparing the process rate trend with a controlling algorithm, and signaling detection of a performance drift if the data triggers the process controlling algorithm.

Embodiments of the invention may further provide an apparatus for monitoring a process chamber and for adjusting the process recipe in real time during substrate processing within the process chamber. The apparatus includes a process chamber, a metrology tool for measuring film thickness and critical dimension (CD) information that is coupled to the process chamber, a computer system for calculating the process rate, storing thickness and CD measurement and process rate information.

BRIEF DESCRIPTION OF THE DRAWINGS

So that the manner in which the features of the invention described herein are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

FIG. 2a shows the etching activities of reactant species (R) and the passivating function of by-product species (B). FIG. 2b shows a deep trench profile (normal) after silicon deep trench etch.

FIG. 3a shows the limited etching activities of reactant species (R) in the trench, excess etching of the BSG layer, and the limited availability of by-product species (B) to passivate the top BSG layer. FIG. 3b shows a deep trench profile (pinched-off) after silicon deep trench etch.

FIG. 5 is a schematic diagram of wafer movement and metrology data collection of wafers processed through an etch chamber that is not integrated with a metrology tool.

FIG. 6 is a schematic diagram of wafer movement and metrology data collection of wafers processed through an etch chamber that is integrated with a metrology tool.

DETAILED DESCRIPTION

Semiconductor device fabrication requires feature patterning. When the device being fabricated is a DRAM, one step in the device fabrication process is silicon deep trench etching to form trench capacitors. The present invention is a method and apparatus that finds use in device fabrication and is especially useful in deep trench etching.

More specifically, the invention measures the thickness of a material layer on a substrate using an integrated metrology tool that is coupled to a substrate processing chamber (e.g., a deep trench etch system). The measurement data are utilized and tracked by the substrate-processing chamber to adjust a process recipe in real time, and to detect process drift. As such, the real time adjustment of the process recipe facilitates accurate processing of the substrate. The real time process information also assists in shortening the process development cycle.

For convenience, the present invention is described herein primarily with reference to deep silicon trench etch for DRAM trench capacitor preparation. The invention can be used for other types semiconductor substrate preparation processes, including, but not limited to, other etch processes and deposition processes. Details of a high aspect ratio trench (HART) etcher and etching chemistry that are used to etch deep silicon trenches for this application have been disclosed in commonly assigned U.S. patent application Ser. Nos. 09/704,887 and 09/705,254, both titled "Etching of High Aspect Ratio Features in a Substrate", and both filed on Nov. 1, 2000.

Figure 1:
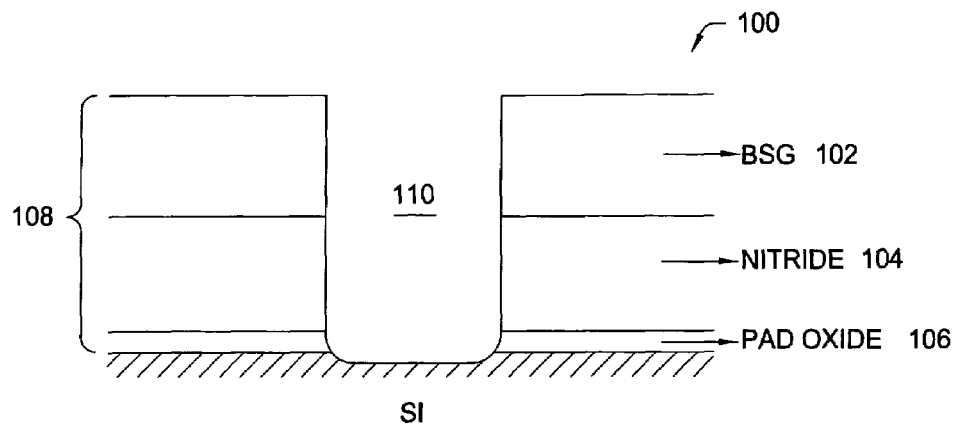
FIG. 1 is a cross-sectional diagram of a patterned wafer prior to high aspect ratio deep trench etch processing.

FIG. 1 shows a cross-sectional diagram of one embodiment of a patterned wafer 100 prior to high aspect ratio deep trench silicon etch. The patterning stack 108 that defines the location of a trench to be formed may include 7000 Å to 1 μm BSG (borosilica glass) 102, 2000 Å of silicon nitride 104, and 100 Å of pad oxide 106. The patterning stack 108 is placed on top of a bare silicon surface 112. In FIG. 1, the patterning stack 108 has already been opened using a conventional patterning process to form gap 110 and is ready for silicon deep trench etch. The reactants used to etch a deep trench in silicon generally involve a combination of one or more gases including $SF_6$, HBr, $NF_3$, $O_2$ (or He—$O_2$), Cl2, $Br_2$, other Halogen-based compound, $SiF_4$, $C_4F_8$, other fluorocarbon ($C_xF_y$) and hydrofluorocarbon (HFC or $C_xH_{ill\ Fz}$). The silicon deep trench etching process is relatively sensitive to changes in the process chamber, such as changes in chamber pressure, gas flow, by-product re-deposition on the chamber wall, chamber temperature, and substrate temperature. In one study involving $O_2$ as one of the reactive gases that produces a passivating by-product, such as $SiO_2$ or $SiO_xBr_y$, a mere 4-5% reduction in $O_2$ flow rate (e.g. 2/50 sccm) could move the process into an un-operable regime. The silicon deep trench etching process is also relatively sensitive to the size of opening for sub-0.14 μm device manufacturing. If the process is designed for processing 0.14 μm targeted CDs (critical dimensions) and incoming substrates have trench openings that average significantly below 0.14 μm (e.g., an average of 0.12 μm), the process might not be able to etch the trenches to the depth of 6-7 μm. Details of how to use an integrated CD metrology tool to gather and utilize pre-etch and post-etch CDs and device feature profiles of wafers going through the etch chamber have been disclosed in commonly assigned U.S. Pat. No. 6,486,492, titled "Integrated Critical Dimension Control for Semiconductor Device Manufacturing", issued on Nov. 26, 2002, U.S. Pat. No. 6,388,253, also titled "Integrated Critical Dimension Control for Semiconductor Device Manufacturing", issued on May, 14, 2002, and U.S. application Ser. No. 10/428,145, titled "Method and Apparatus for Controlling Etch Processes During Fabrication of Semiconductor Devices", filed on May 1, 2003. Details of how to use an in-situ CD metrology tool to gather CD data have been disclosed in commonly assigned U.S. application Ser. No. 60/479,601, titled "Method and System for Monitoring an Etch Process", filed on Jun. 18, 2003. Device feature profiles and CDs can be used together to fine tune the etch recipe.

Figures 2A, 2B:
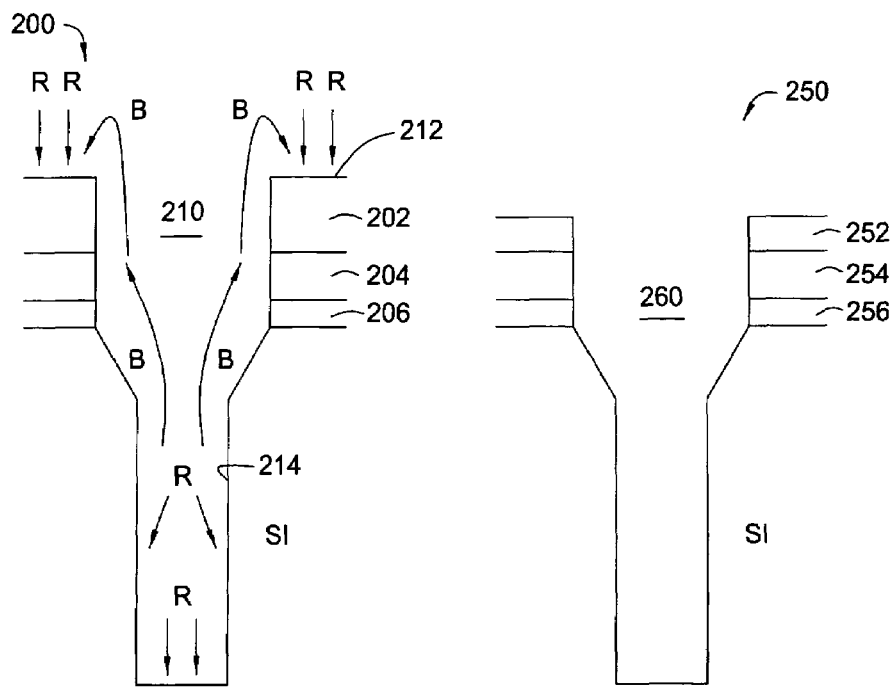
FIGS. 2a and 2b are cross-sectional diagrams of a silicon deep trench etch under "normal" chamber condition.

FIG. 2A shows the surface reaction of silicon deep trench etch when the etch chamber is operated under a normal (or "good") condition, such as correct gas flow control and substrate temperature, etc., and the CDs of the trench openings 210 are not outside the control limit. Reactants (R) are distributed across the substrate surface 212 and trench 210 surface to etch the surface 212 of the BSG mask layer 204 and also the silicon surface 214 in the trench. The by-products (B) generated from the etching process, such as $SiO_2$, would escape from the trench 210 to passivate the BSG mask surface 212 and would slow the BSG mask etch rate. FIG. 2B shows the post etch silicon trench profile 250. The post-etch BSG thickness 252 is thinner than pre-etch thickness 202, but a sufficient amount, such as 1000-2000 Å is still left, as planned.

Figures 3A, 3B:
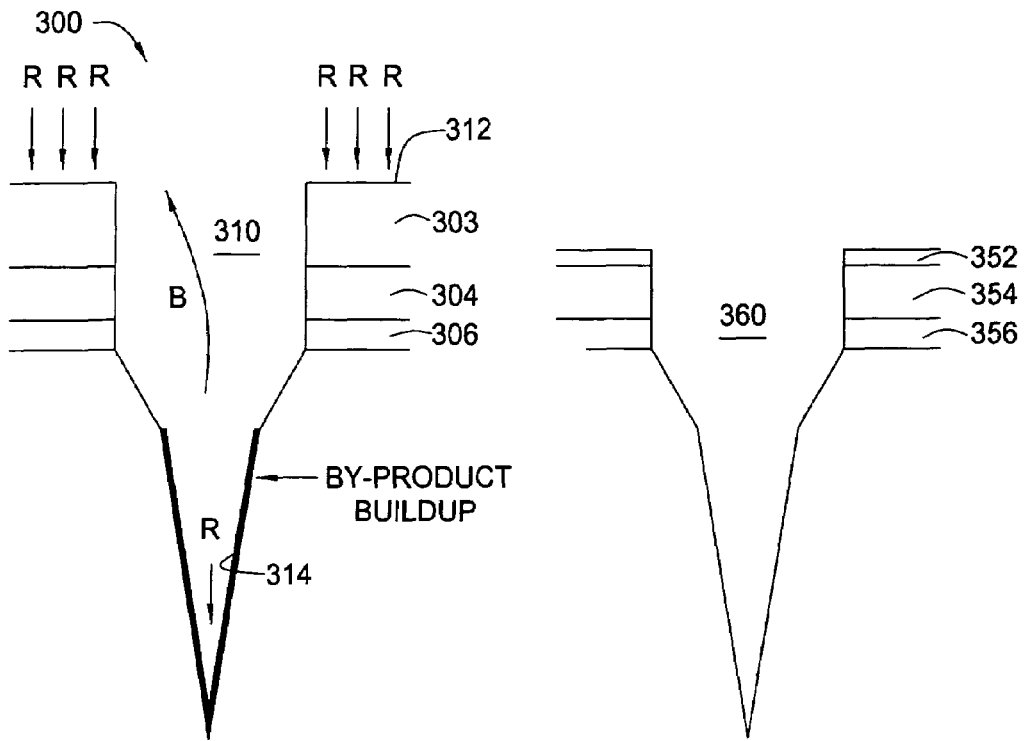
FIGS. 3a and 3b are cross-sectional diagrams of a silicon deep trench etch under "abnormal" chamber condition.

On the other hand, when the chamber condition is abnormal, such as out of specification chamber pressure, or when the wafer CDs are below the control limit, the reactants (R) cannot reach deep into trench 310 to further the etching process (see FIG. 3A). The abnormal chamber condition can result in by-product (B) buildup at the silicon trench surface 314 that prohibit reactant (R) from etching the silicon surface, which can cause the trench to show a pinch-off shape. Since the reactants (R) cannot be distributed across the silicon trench surface 314 to etch silicon, higher amount of reactants (R) are available to etch BSG surface 312 and increases its etch rate. In addition, since less silicon etch occurs in the trench 310, fewer by-products (B) are available to redeposit on the substrate surface 312 (also BSG surface) to slow down the BSG etch rate. The net result is a much thinner BSG 352 or no remaining BSG after etch (see FIG. 3B).

By subtracting the post-etch BSG thickness from the pre-etch BSG thickness, the BSG etch rate can be calculated and the health of the etch performance can be monitored. A significant increase in BSG etch rate could signal a process drift that is caused by chamber abnormality or wafer CDs that are lower than the CD specification. The cause of significant BSG etch rate increase by lower than specified wafer CDs can be ruled out by examining the pre-etch wafer CDs measurement using an integrated CD metrology tool described above. The thickness measurement, CD measurement and device feature profiles can be performed in the same metrology tool that utilizes optical scatterometry or reflectometry. The thickness measurement and CD measurement could also be conducted in separate, but integrated, metrology tools. The concept of this invention can also be extended to other film characterization tools, such as FTIR (Fourier-Transform Infra-Red) for film composition analysis.

Figure 4:
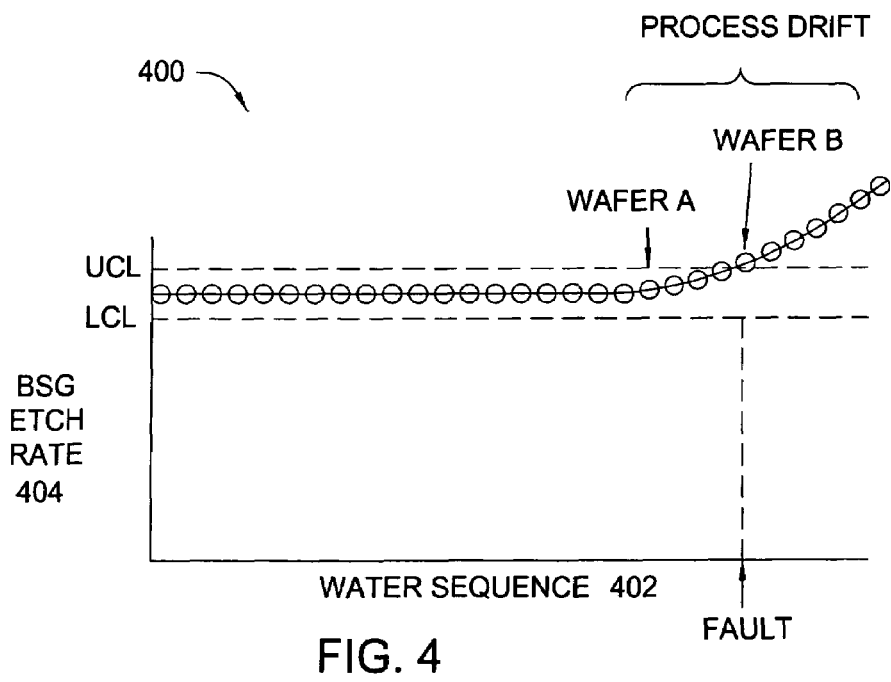
FIG. 4 is an etch rate trend graph for a silicon etch chamber.

FIG. 4 shows a BSG etch rate trend graph 400. The X-axis represents the sequence of wafers 402 that have been monitored for etch rate. The wafers on the left are processed before wafers on the right. For wafers processed in a silicon deep trench etcher with an integrated metrology tool(s), ideally every wafer is monitored for BSG etch rate. However, this is not necessary. Monitoring every other wafer or every few wafers is also acceptable. The Y-axis represents the BSG etch rate 404, which is calculated by subtracting post-etch thickness from pre-etch thickness and then dividing the net value by the etch process time. The BSG etch rate of wafers that begin processing having within specification CDs and are processed under "normal" chamber condition, are expected to fall within upper control limit (UCL) and lower control limit (LCL). The graph 400 represents process drift beginning at wafer A when the BSG etch rate of wafer A rises slightly above the process trend. The BSG etch rate trend after wafer A continues to rise and exceeds the UCL for wafer B. Wafers processed after wafer A have the risk of having a pinched-off trench profile and might need to be scrapped. Wafers processed after wafer B will likely be scrapped.

Traditionally, a deposition or etch chamber is not integrated with a metrology tool (see FIG. 5). For an etch process chamber that is not integrated with a metrology tool 500, the delay time would be long to transport wafers (wafer cassette 506) from metrology tool 504 to etch tool 508. Then the wafer cassette 510 is transported back to the metrology tool 504. Precious time is wasted in moving the wafer box (or cassette) and also in waiting for the cassette to be moved through a queue. Typically only a couple of wafers from each lot 502 are selected to measure post-etch critical dimensions (CDs) to make sure that the CDs meet the specification. Patterning stack thickness is typically not monitored. This is due to concern over delay caused by additional wafer movement and queue time to take the measurement at a non-integrated metrology tool. If wafers were confirmed to have suffered from deep trench pinch-off problem at a later stage by cross-section SEM and the cause is confirmed to be due to chamber abnormality, many lots of wafers processed before the problem is identified would likely need to be scrapped. The cost of the scrapped wafers could be very high. Even if selected wafers of a processed lot are measured for BSG post-etch thickness to check for chamber stability, since the metrology tool is not integrated, several lots could be processed before the measurement results are obtained. As such, the risk of not identifying the process drift immediately still exists.

On the other hand, when an etcher 606 is integrated with an ex-situ metrology tool 604 or an in-situ metrology tool 610 to form an integrated system 608, as shown in FIG. 6, no time will be wasted on physical movement of the cassette and waiting in a queue. The integrated system 608 allows measuring BSG thickness before and after processing for every wafer going through the etch chamber at no additional cost of wafer throughput. Deep trench etching of 6-7 µm silicon can take between 5 to 10 minutes per wafer, while a 9-point thickness measurement using an optical-scatterometry-based metrology tool would take less than 2 minutes. The thickness measurement time could further be lowered by reducing the number of measurement sites (points). The data gathered by the metrology tool can be instantly fed to a data processor connected to the etch chamber. Consequently, there may be no impact on wafer processing throughput.

Figure 7:
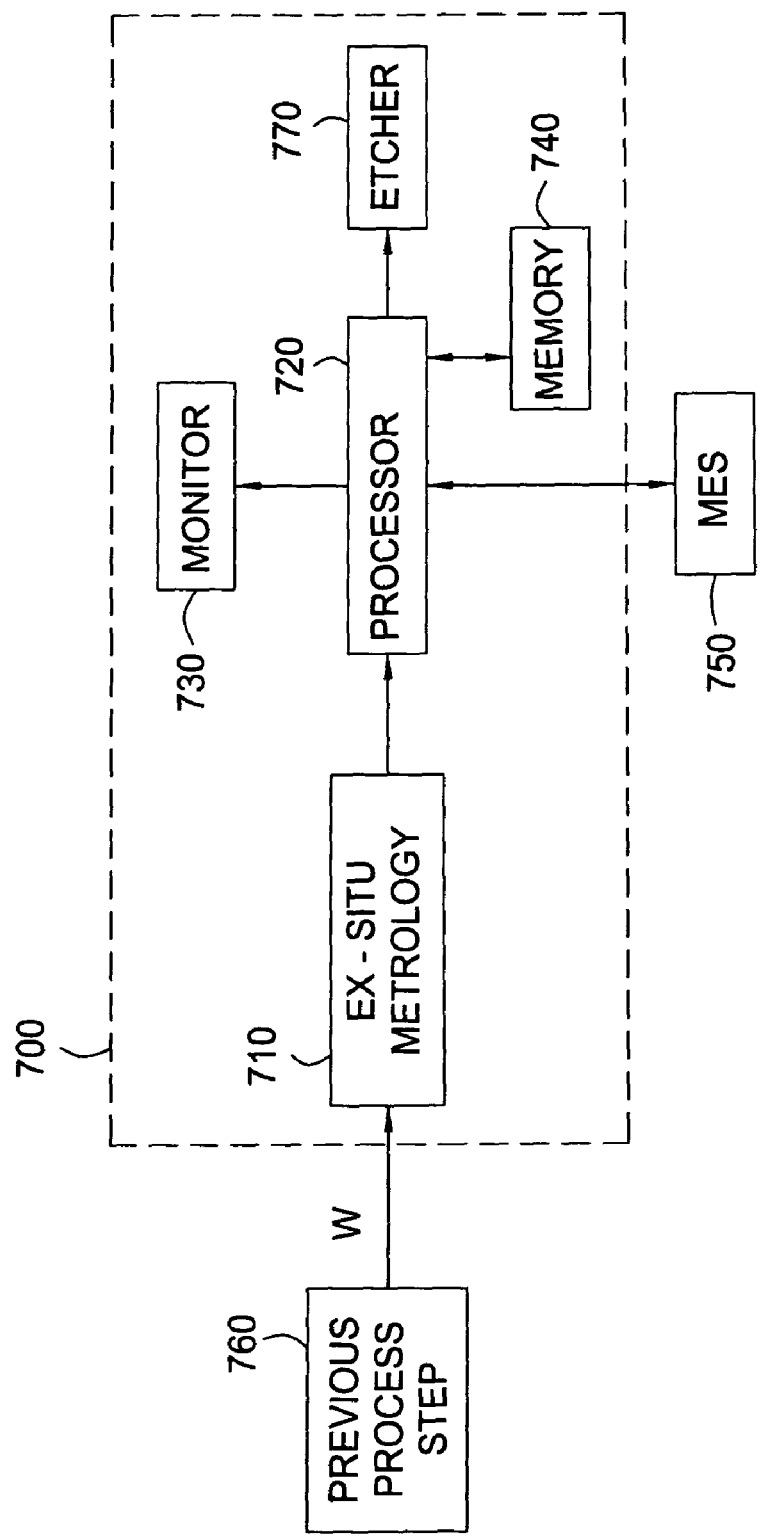
FIG. 7 is a block diagram of key components of an integrated etch system.

An exemplary embodiment of the present invention is implemented using an ex-situ metrology tool 710 (measurement tool) in a processing line 700, as shown in FIG. 7, comprising a measuring tool 710, e.g., an optical metrology tool such as Nano OCD 9000 available from Nanometrics of Milpitas, Calif. The metrology tool 710 can utilize scatterometry or reflectometry techniques. The use of scatterometry for inspection and metrology tools is disclosed in Raymond, "Angle-resolved scatterometry for semiconductor manufacturing", *Microlithography World*, Winter 2000. The use of reflectometry for inspection and metrology tool is taught in Lee, "Analysis of Reflectometry and Ellipsometry Data from Patterned Structures", *Characterization and Metrology for ULSI Technology:* 1998 *International Conference*, The American Institute of Physics 1998. Other metrology and/or wafer inspection techniques may be used. The processing line 700 further comprises a processor 720, which performs the analysis disclosed herein electronically, and a monitor 730 for displaying results of the analysis of the processor 720. The processor 720 can be in communication with a memory device 740, such as a semiconductor memory, and a computer software-implemented database system 750, known as a "manufacturing execution system" (MES) conventionally used for storage of process information.

Figure 8:
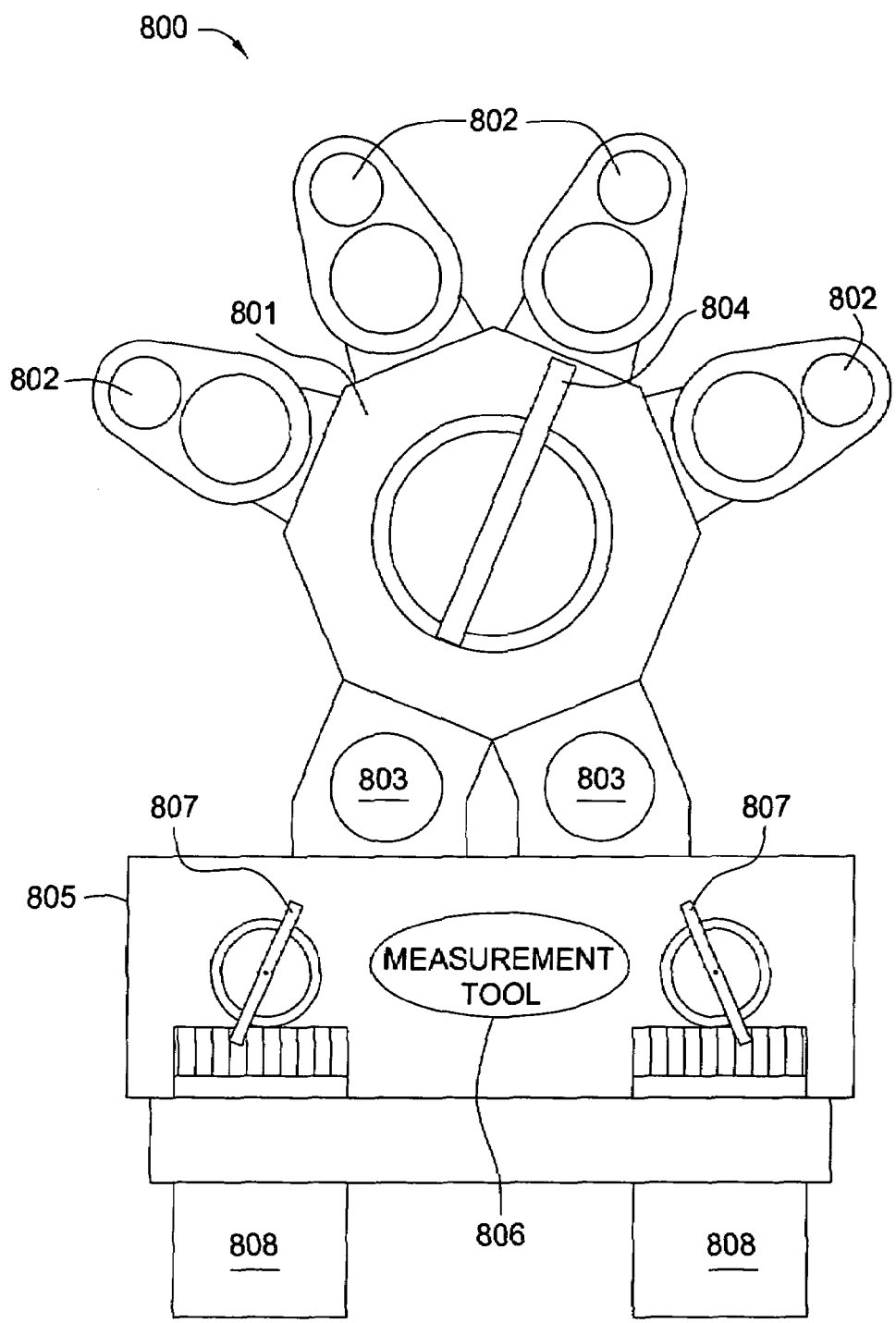
FIG. 8 is a diagram of one embodiment of an integrated etch system.

An example of an etch system that is integrated with an ex-situ metrology tool with the capability of measuring CDs and film thickness is Applied Materials' Transforma system 800 (FIG. 8). Detailed information describing Applied Materials' Transforma system has been disclosed in a commonly assigned U.S. patent application Ser. No. 10/428,145, titled "Method and Apparatus for Controlling Etch Processes During Fabrication of Semiconductor Devices", filed on May 1, 2003. The system comprises a chamber or "mainframe" 801, such as the Centura™ processing system for mounting a plurality of processing chambers, e.g., conventional etch reactors 802, such as DPSII™ silicon etch chambers and one or more transfer chambers 803, also called "load locks". In one embodiment of the present invention, four etch reactors 802 are mounted to the mainframe 801. In one exemplary embodiment, three etchers 802 are used for etching and one is optionally used for post-etch cleaning (i.e. removing photoresist polymers and other residue from wafers after etching). A robot 804 is provided within the mainframe 801 for transferring wafers between the processing reactors 802 and the transfer chambers 803. The transfer chambers 803 are connected to a factory interface 805, also known as a "mini environment", which maintains a controlled environment. A metrology (or measurement) tool 806 could be integrated in the load lock area 805 and with high-speed data collection and analysis capabilities, every wafer that enters the system 800 can be measured for thickness before and after etch processing. The metrology tool 806 could also be placed at different location within the process system 800. One or more of the process chambers 802 could also be deposition chambers, since the concept of the invention also applies to deposition process.

Figure 9:
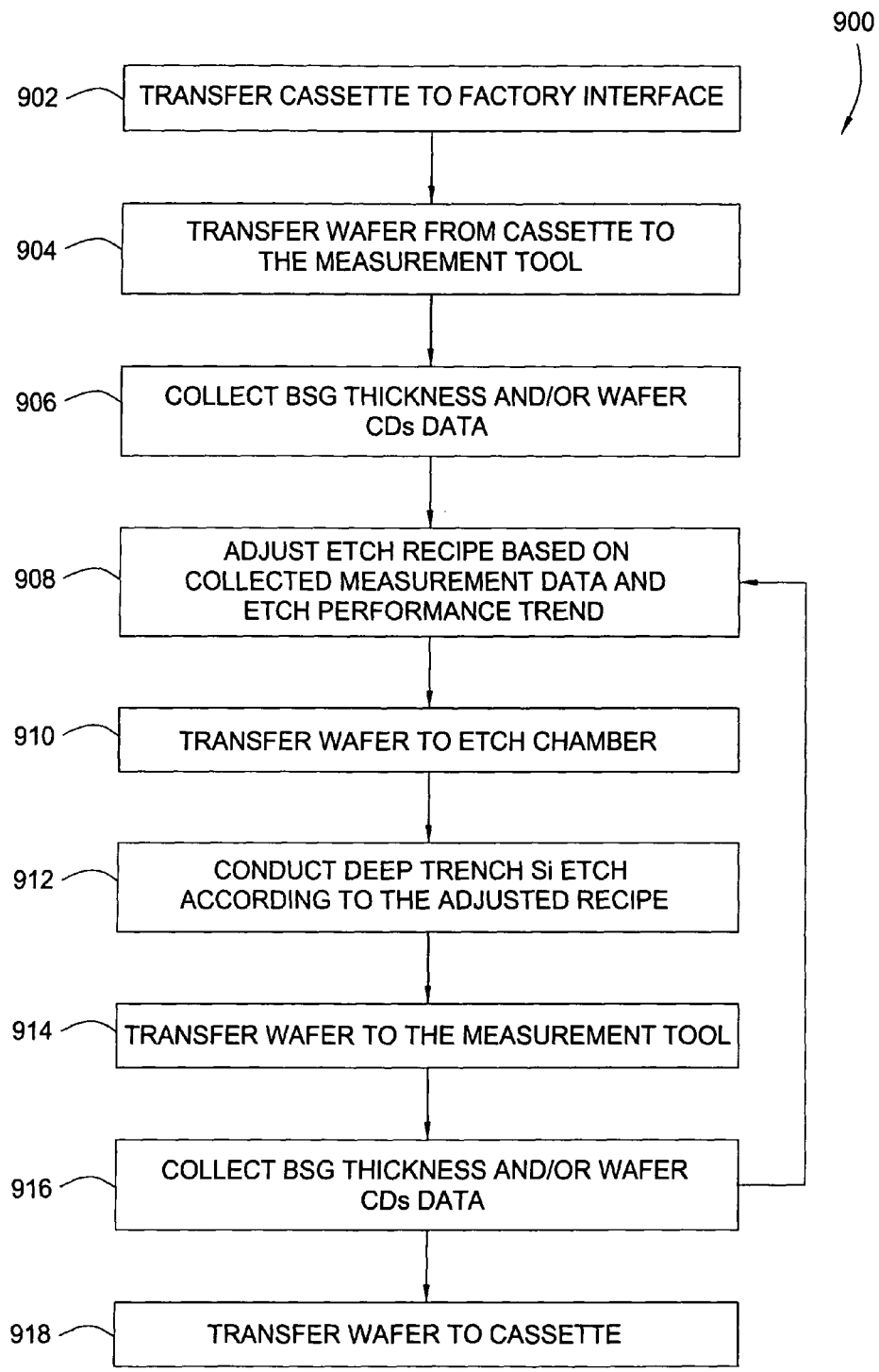
FIG. 9 is a process flow diagram of etching wafers in a process system with an integrated ex-situ metrology tool.

The operation of the apparatus according to this embodiment of the present invention will now be described with reference to the flow chart of FIG. 9. After the wafers are processed at a processing tool to form a photoresist mask on an underlying layer, they are loaded into the cassette 808, and the cassette is transferred to a factory interface 805 at step 902. A wafer is then unloaded from the cassette 808 and transferred to the metrology tool 806 using a robot 807 (step 904). At step 906, the thickness of the film, the CDs, and device feature profiles are collected. At step 908, an etch recipe for the wafer is adjusted based on the thickness measurement, the CDs, and device feature profiles, as explained above. At step 910, the wafer is transferred from the metrology tool 806 to the etcher 802 using the robot 807 to move the wafer to the transfer chamber 803, and using the robot 804 to move the wafer to the etcher 802. At step 912, the wafer undergoes a silicon deep trench etch according to the recipe. The wafer is then transferred back to the metrology tool 806 for a post-etch CD measurement, device feature profiles and a thickness measurement before being loaded into the cassette 808 at step 918. The thickness measurement, and post etch CDs, and device feature profiles are coupled to the processor 720, and used to calculate BSG etch rate and/or to correct etch recipe for the next wafer to be etched, as explained above. Detailed information of how to adjust etch recipe is described in a commonly assigned U.S. patent application Ser. No. 10/428,145, titled "Method and Apparatus for Controlling Etch Processes During Fabrication of Semiconductor Devices", filed on May 1, 2003.

An example of an in-situ metrology tool 610, described in FIG. 6, with the capability of measuring CDs and film thickness is the EyeD™ metrology module, available from Applied Materials of Santa Clara, Calif. The EyeD™ metrology module may use one of more non-destructive optical measuring techniques, such as spectroscopy, interferometry, scatterometry, reflectometry, and the like. The in-situ metrology tool may be, for example, configured to perform an interferometric monitoring technique (e.g., counting interference fringes in the time domain, measuring position of the fringes in the frequency domain, and the like) to measure the etch depth profile of the structure being formed on the substrate in real time. Details of how to use an in-situ CD metrology tool to gather CD data have been disclosed in commonly assigned U.S. application Ser. No. 60/479,601, titled "Method and System for Monitoring an Etch Process", filed on Jun. 18, 2003. Device feature profiles and CDs can be used together to fine tune the etch recipe. Details of how to use an in-situ thickness metrology tool to gather thickness data have been disclosed in commonly assigned U.S. Pat. No. 6,413,837, titled "Film Thickness Control Using Spectral Interferometry", issued on Jul. 2, 2002, and U.S. application Ser. No. 60/462,493, titled "Process Control Enhancement and Fault Detection Using In-Situ and Ex-situ Metrologies and Data Retrieval In Multiple Pass Wafer Processing, filed on Apr. 11, 2003.

Figure 10:
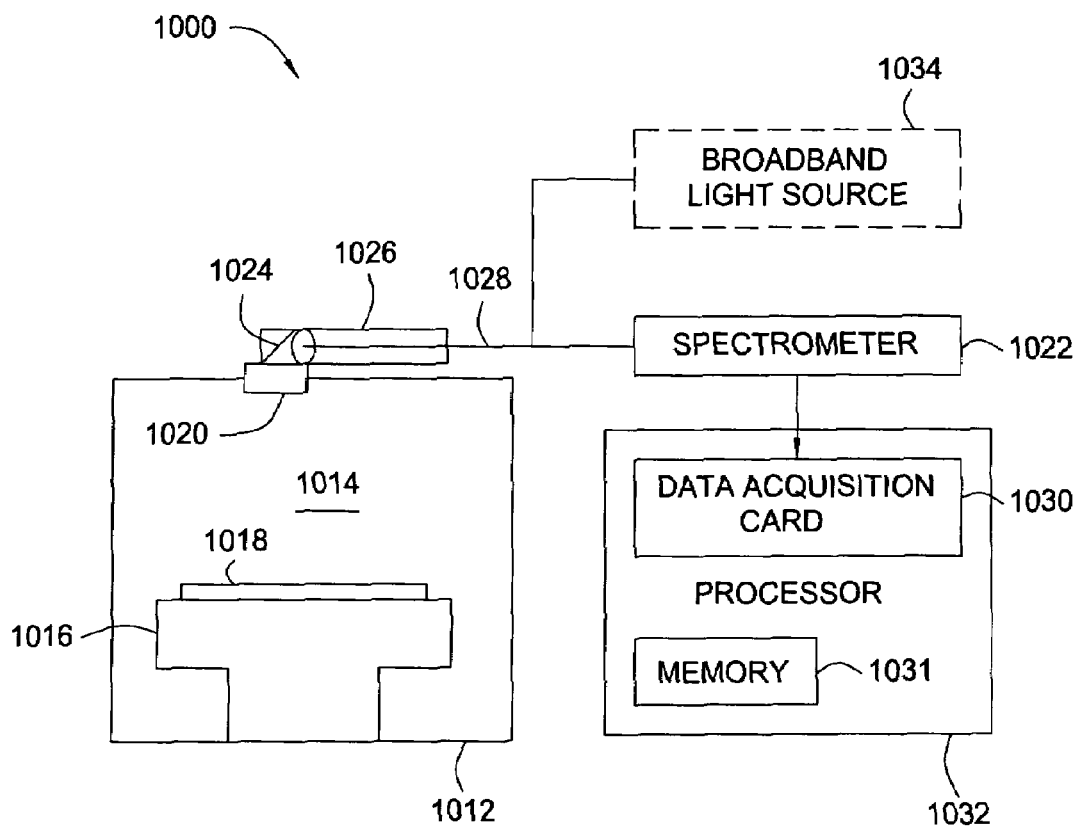
FIG. 10 is a simplified cross-sectional view of an exemplary plasma etch chamber configured to practice the method of present invention.

FIG. 10 is a simplified cross-sectional view of an exemplary plasma etch chamber 1000 configured to practice the method of present invention. As shown in FIG. 10, etch chamber 1000 includes a housing 1012 that surrounds a substrate processing region 1014. During an etch process a substrate 1018 is supported on a pedestal 1016 and exposed to a plasma formed in region 1014. The plasma generates electromagnetic radiation that includes emissions having wavelengths in the optical spectrum (i.e., from about 180 to 1100 nm). A portion of these emissions are reflected from the surface of substrate 1018 and through a window 1020 so they can be measured by the spectrometer 1022. A folding mirror 1024 reflects the radiation that passes through the window 1020 towards a lens 1026 that collimates the radiation into a fiber optic cable 1028. The fiber optic cable 1028 is the vehicle through which the radiation travels to reach the spectrometer 1022. The folding mirror 1024 and the lens 1026 are positioned so that radiation reflected from the upper surface of the substrate 1018 passes through the window 1020 vertically into the optical fiber 1028. Placement of the window 1020 above the substrate 1018 as shown in FIG. 1 allows better resolution of the measured radiation as opposed to placement of the window on the side of the chamber but other embodiments may position window 1020 on the chamber side.

In embodiments that employ a broadband light source 1034 in addition to or instead of the plasma emission, the fiber optic cable 1028 is a bifurcated cable. In these embodiments, the light source 1034 is optically coupled to one of the channels of the bifurcated cable 1028 and the spectrometer 1022 is coupled to the other channel. Light from the broadband light source 1034, e.g., a mercury, deuterium or xenon lamp, travels along one channel of the cable 28 through the window 1020 and is reflected from the substrate 1018. The reflected light passes through the window 1020 into the other channel of the cable 1028 as described above before finally reaching the spectrometer 1022. The spectrometer 1022 spectrally separates radiation based on wavelength (e.g., via a prism or diffraction grating), and generates detection signals (e.g., detection currents) for a plurality of the spatially separated wavelengths. A data acquisition card 1030 is coupled to a processor 1032 to collect and process data representing the separated wavelengths. The data is collected at a periodic sampling rate by the data acquisition card 1030 and each sample is processed by the processor 1032. In one embodiment, the processor 1032 also controls the operation of chamber 1000 by executing computer instructions stored in a memory 1031 coupled to the processor.

Figure 11:
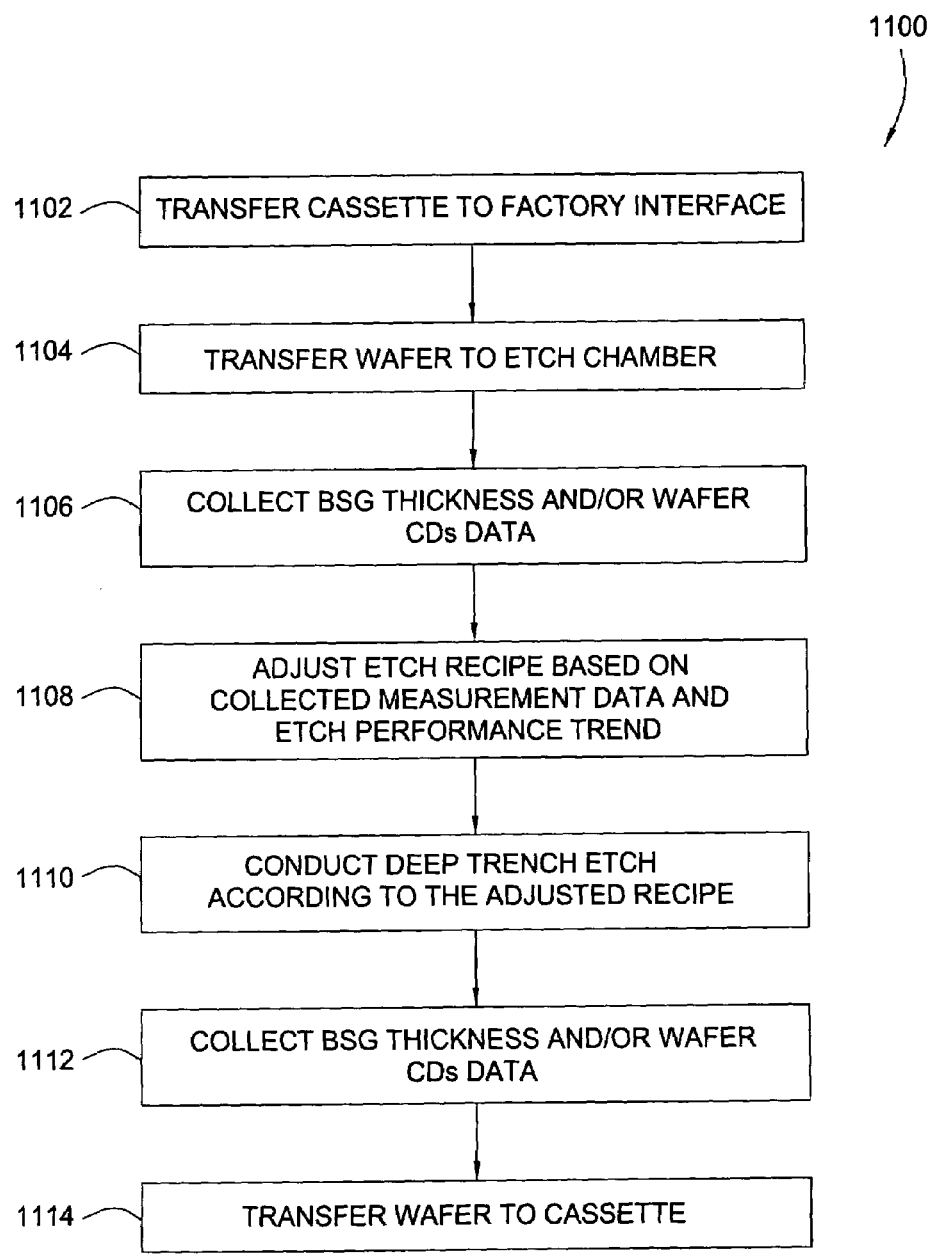
FIG. 11 is a process flow diagram of etching wafers in a process system with an in-situ metrology tool.

The operation of the apparatus according to this embodiment of the present invention will now be described with reference to the flow chart of FIG. 11. After the wafers are processed at a processing tool to form a photoresist mask on an underlying layer, the wafers are loaded into the cassette 808, and the cassette is transferred to a factory interface 805 at 1102. At step 1104, a wafer is then unloaded from the cassette 808 and transferred to the etcher 802 using robot 807 to move the wafer to the transfer chamber 803, and using the robot 804 to move the wafer to etcher 802. At step 1106, the thickness of the film, the CDs, and device feature profiles are collected. At step 1108, an etch recipe for the wafer is adjusted based on the thickness measurement, the CDs and the device feature profiles, as explained above. At step 1110, the wafer undergoes a silicon deep trench etch according to the recipe. At step 1112, the post-etch thickness of the film, the CDs, and device feature profiles are collected again. The thickness measurement, the post etch CDs, and device feature profiles are coupled to the processor 1031, and used to calculate BSG etch rate and/or to correct etch recipe for the next wafer to be etched, as explained above. Afterwards, the wafer is transferred back to the cassette at step 1114.

Figure 12:
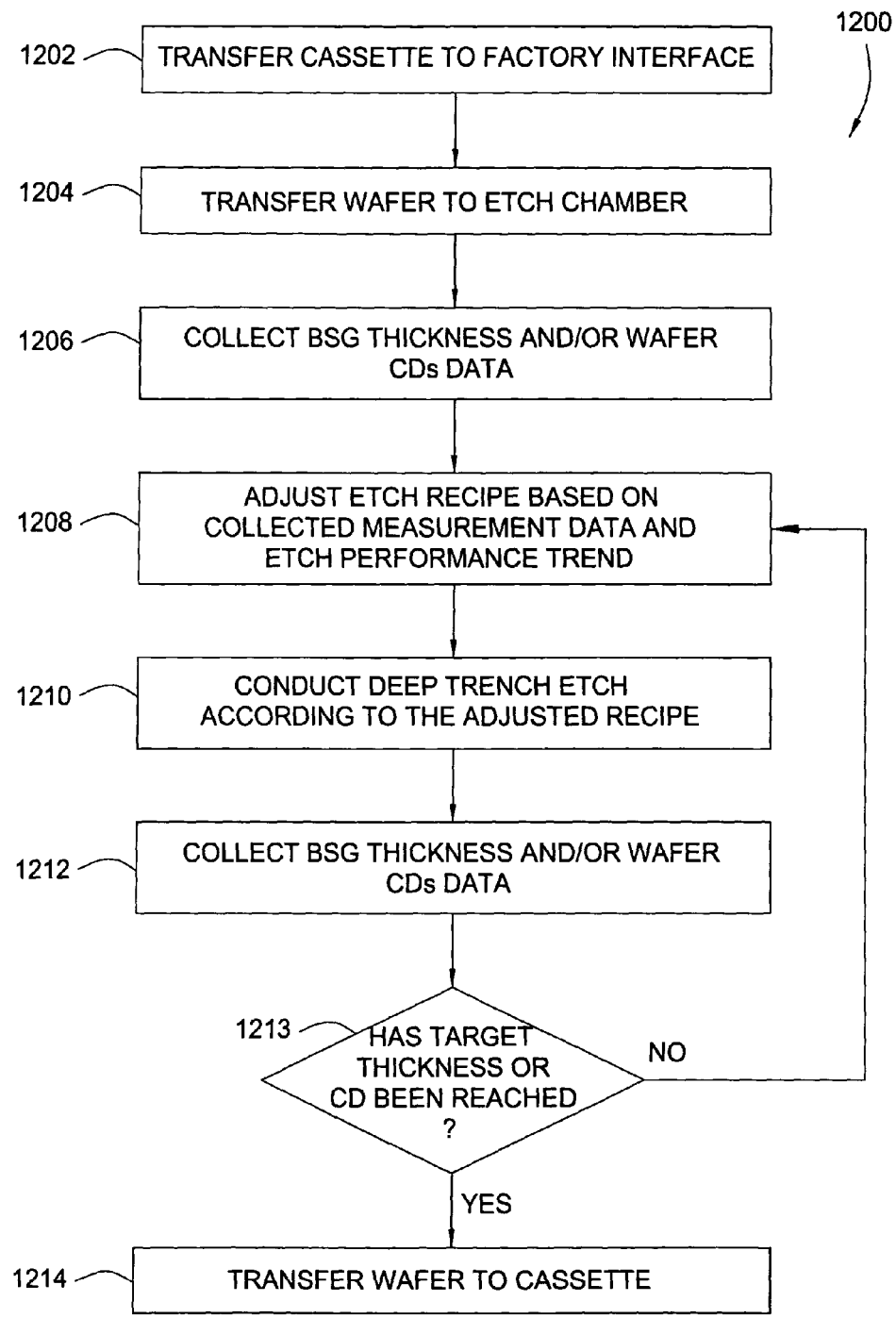
FIG. 12 is a process flow diagram of etching wafers in a process system with an in-situ metrology tool.

Film thickness, CDs, and device feature profiles can also be collected continuously during the etching process to instantaneously adjust the etch recipe until the targeted thickness or CD is reached. This process is shown in FIG. 12. The steps in FIG. 12 have similar functions to steps in FIG. 11. In the process flow of FIG. 12, there is an additional decision making step 1213 to determine if the targeted thickness or CD has been reached or not. If the targeted thickness or CD has not been reached, the process step loops back to step 1208 until the targeted thickness or CD has been reached.

The integrated metrology system solves the delay problems caused by wafer transportation time and queue wait time. It has other advantages over a traditional etch chamber that is not integrated with a metrology tool. For example, the pre-etch and post-etch measurement of a particular wafer can be tracked to calculate the etch rate of the particular wafer to reflect a more accurate chamber performance, compared to the sampled post-etch thickness monitoring. Furthermore, since performance of every wafer is instantly tracked, indications of a process drift can be alerted to an operator instantly to take immediate action. This would prevent misprocessing of following wafers and unnecessary wafer scrapping. Since the measurement tool also has the capability of measuring wafer CDs, concerns over lower than specification causing higher BSG etch rate could be ruled out by examining the pre-etch wafer CDs. In addition, the pre-etch measurement, e.g. CDs, device feature profile, and optionally BSG thickness, can be fed-forward to the etch chamber that utilizes the etch chamber performance trends, such as etch rate and CD trends, to adjust etch recipe for each individual wafer for best etch performance and process control. Lastly, the instant tracking and revealing of etch results by the integrated data processor can greatly reduce the etch process development time. In contrast, development conducted in a non-integrated system is relatively slow, since the data collection is very time consuming.

The invention can also be applied to other process chambers, such as deposition chambers. The metrology tool described as being used in one embodiment of the invention can also be other types of film characterization tools, such as FTIR (Fourier-Transform Infra-Red) for film composition analysis.

Accordingly, while the present invention has been disclosed in connection with various embodiments thereof, it should be understood that other embodiments might fall within the spirit and scope of the invention, as defined by the following claims.

What is claimed is:

1. A method of monitoring a process performed by a etch chamber, comprising:
   collecting pre-process measurement data prior to substrate processing using an integrated metrology tool;
   processing the substrate in the etch chamber;
   recording a total processing time;
   collecting post-process measurement data after substrate processing using the integrated metrology tool, wherein the pre-process measurement data and post-process measurement data include both thickness measurement and critical dimension information;
   calculating a process rate by subtracting post-process measurement data from pre-process measurement data and dividing the result by the total processing time;
   computing a process rate trend;
   comparing the process rate trend to a limit level;
   signaling detection of a performance drift when the process rate trend exceeds the limit level;
   examining a pre-etch critical dimension information; and
   excluding a contribution of the critical dimension of a feature as a cause of the process drift, if the pre-etch critical dimension information is within a pre-defined critical dimension specification.

2. The method of claim 1 wherein each movement of the substrate is performed within a vacuum.

3. The method of claim 1 wherein the integrated metrology tool performs at least one of scatterometry and reflectometry to produce pre-process and post-process measurement data.

4. The method of claim 1, further comprising:
   adjusting, in real time, a process recipe used by the etch chamber to process the substrate based on the pre-process measurement data and a process rate.

5. The method of claim 4, wherein the process rate trend is an etch rate trend.

6. The method of claim 1, wherein the integrated metrology tool is an in-situ metrology tool.

* * * * *